United States Patent
Thomas

(10) Patent No.: US 7,554,467 B2
(45) Date of Patent: Jun. 30, 2009

(54) NETWORK CONTENT IN DICTIONARY-BASED (DE)COMPRESSION

(75) Inventor: Kasman E. Thomas, Wilton, CT (US)

(73) Assignee: Novell, Inc., Provo, UT (US)

( * ) Notice: Subject to any disclaimer, the term of this patent is extended or adjusted under 35 U.S.C. 154(b) by 26 days.

(21) Appl. No.: 11/888,248

(22) Filed: Jul. 31, 2007
(Under 37 CFR 1.47)

(65) Prior Publication Data
US 2009/0037448 A1    Feb. 5, 2009

(51) Int. Cl.
*H03M 7/00* (2006.01)
(52) U.S. Cl. ........................ 341/106; 341/107
(58) Field of Classification Search .............. 341/51, 341/65, 67, 95, 106, 107
See application file for complete search history.

(56) References Cited

U.S. PATENT DOCUMENTS

| | | | |
|---|---|---|---|
| 5,663,721 A * | 9/1997 | Rossi | 341/51 |
| 5,953,503 A | 9/1999 | Mitzenmacher et al. | |
| 6,903,669 B1 * | 6/2005 | Subramaniam | 341/106 |
| 6,961,011 B2 * | 11/2005 | Matthews | 341/87 |
| 7,406,202 B2 * | 7/2008 | Kodama et al. | 382/232 |
| 2005/0027731 A1 | 2/2005 | Revel | |
| 2005/0276570 A1 | 12/2005 | Reed, Jr. et al. | |

* cited by examiner

*Primary Examiner*—Brian Young
(74) *Attorney, Agent, or Firm*—King & Schickli, PLLC

(57) ABSTRACT

Apparatus and methods are described for network content in dictionary-based (de)compression. Content for compression is parsed into discrete constructions, such as phrases, words, etc. The discrete constructions are passed to a searching engine to locate network information at one or more network locator identities, such as URI's (URL's, URNs) that correspond to the discrete constructions. Upon locating the network information, a dictionary of entries corresponding to the content is created. The content is encoded from the dictionary by indicating raw or relative offsets into the network information per each of the network locator identities. Decoding occurs anti-symmetrically to the encoding. In this manner, the vastness of network content, e.g., the world wide web, is leveraged to provide relevant dictionaries for de-/encoding. Searching for candidate dictionaries, scoring same and safeguarding against volatile dictionary content are other noteworthy features. Computer program products and computing network interaction are also defined.

23 Claims, 9 Drawing Sheets

NETWORK CONTENT IN DICTIONARY-BASED (DE)COMPRESSION

FIELD OF THE INVENTION

Generally, the present invention relates to computing environments involving compression and decompression of material. Particularly, it relates to leveraging the vastness of network content, such as that found on the world wide web, to serve as dictionaries in encoding/decoding the material. Various features relate to computer software products, systems for same and methods. Searching for candidate dictionaries, scoring same and safeguarding against volatile dictionary content, to name a few, are other noteworthy features.

BACKGROUND OF THE INVENTION

Contemporaneous data compression technologies tend to rely on one of two tactics: 1) redundancy removal by entropy-optimized re-encoding of a source file, based on self-similarity analysis of the file; or 2) static-dictionary-based substitution coding. A key difference between the two is that the former need not rely on external information being supplied. For example, any dictionary developed in the course of compressing an input file is built dynamically from redundancies in the input data itself. (The logic starts with no a-priori assumptions about the file nor any dictionaries.) In the latter, an externally developed dictionary or codebook is consulted for compression. For example, if the file to be compressed is an English text document, an English dictionary can be used to compress it. The text document is simply re-encoded as a series of offsets into the dictionary. (Of course, if an Arabic dictionary is substituted for the English dictionary, very poor compression can be expected, because the Arabic dictionary is not well suited to the data.) By virtue of avoiding any particular dictionary, the former is more general and thus more commonly used. But in use-cases where the latter can be exploited successfully, it tends to provide higher compression ratios.

Static-dictionary compression can be very effective. For example, products that fit the contents of a large reference source, such as the Bible, into a limited storage space of the size of a palm device generally achieve this feat by building a static dictionary from a concordance of the text, and using that dictionary to reconstruct the verses. This results in a high level of text reuse, since it is only necessary to store a common phrase like "thou shalt not" once, merely pointing to it from then on. Building dictionaries, however, represents a computational burden to (de)compression. Using existing dictionaries to fit to-be-compressed material represents difficulty in not only finding a best dictionary, but in making sure it has adequate entries corresponding to the material.

In view of these various problems, there is need in the art of dictionary-based (de)compression to easily find, use and/or build dictionaries to achieve excellent compression ratios. Making sure the dictionary is semantically well-tailored to the material is another need. In the world of computing, there is continually a need to leverage existing technologies. Any improvements along such lines should further contemplate good engineering practices, such as relative inexpensiveness, stability, ease of implementation, low complexity, flexibility, etc.

SUMMARY OF THE INVENTION

The above-mentioned and other problems become solved by applying the principles and teachings associated with the hereinafter-described network content in dictionary-based compression and decompression. In a basic sense, content for compression in a computing environment is parsed into discrete constructions, such as phrases, words, etc. The discrete constructions are passed to a searching engine (to leverage existing algorithms) to locate network information at one or more network locator identities, such as URI's (URL's, URNs) that correspond to the discrete constructions. Upon locating the network information corresponding, a dictionary corresponding to the content is created. The content is encoded from the dictionary by indicating raw or relative offsets into the network information per each of the network locator identities. Decoding occurs anti-symmetrically to the encoding. In this manner, the vastness of network content, such as is available on the world wide web, is leveraged to provide relevant dictionaries, well-tailored to the content for de-/encoding. In other words, the invention teaches data compression techniques based on using pre-existing web pages (or other network content) as dictionary-initializers for data compression. A representative notion is that conventional search technology can be leveraged in finding a dictionary (web page—network content) that is well-tailored, semantically, to the data to be compressed. This results in potentially much higher compression ratios than could be achieved otherwise. Searching for candidate dictionaries, scoring same and safeguarding against volatile dictionary content are other noteworthy features. Computer program products and computing network interaction are also defined.

At a high level, a representative implementation would use a new or existing searching engine, such as provided by Google, Yahoo!, Altavista, or the like, to locate online concordances for the content to-be-compressed. (Naturally, an assumption exists that the internet, intranet or other network connectivity is present in a computing environment performing encoding/decoding.) To encode the first chapter of Genesis, in continuing with the large reference material, the Bible, the encoding computing device would parse or tokenize Genesis into words and phrases and attempt to find each one in an online concordance, then store just the offsets into the concordance as a file. (Note, however, that different concordances might yield different results. The concordance at URI abc might have a longer average phrase length than the concordance at URI def and hence A might give a better compression efficiency. In this invention, A would be chosen for use in compression and the URI to A would be stored in the compressed output along with the various offsets.) The invention envisions the web (or files on any network) as constituting a large, distributed "concordance," selected pieces of which can be matched to (essentially) any file needing compression, not just books of the Bible.

Further embodiments envision that the content at a single URI, or multiple URIs, can be employed as a dictionary or dictionaries for encoding a file in compressed form. Moreover, the invention contemplates the use of search technology (above) to locate candidate dictionaries that are highly tailored, semantically, to the data to be compressed. Once a dictionary has been chosen, the input file is encoded as a series of offsets into the dictionary. The URIs, of course, are ultimately bundled with the compressed data so that the data can later be decompressed by a decompressor, via reference to the detailed information stored at the URL(s).

In at least one embodiment, a web page or other piece of content on the network, once selected for use as a dictionary, becomes the input to the dictionary-initialization routine of a more conventional algorithm like LZW. As is known, entropy encoders like LZW, Deflate, etc., build their dictionaries on-the-fly, from the input, as input is encountered. These algorithms generally start with a null-filled dictionary buffer (hash table) and/or empty code tree/trie. If the internal dictionaries/trees were pre-initialized with data well-suited to a particular input stream, much time could be saved building-up the dictionary, and high-efficiency compression could begin immediately, at the start of processing. This invention proposes to pre-fill said dictionaries this way using strings parsed from network-locatable content.

Appreciating that content of a dictionary page at a given URI is subject to change (as web content often does), it is potentially no longer reliable for use as a dictionary. Various techniques for mitigating this problem are also addressed.

The invention achieves, among other things: reduced storage requirements for data, such that a user, user agent, device, connected system, etc., can reconstruct a particular file from a very sparse representation of the file; potentially much greater compression efficiency for common types of documents than is attainable using conventional technologies (of the WinZip type); use of conventional algorithms (Deflate, LZW, etc.) to be modified to take advantage of hash-table pre-fill methods based on using semantically appropriate dictionary data culled from the web; leverage of existing search technology to locate semantically appropriate candidate dictionaries that can perform exceptionally well in static-dictionary (codebook lookup) compression methods; fallback techniques that make the invention resistant to the kind of data corruption that could otherwise occur due to sudden disappearance of web pages, unexpected changes to web pages, etc.

In a representative embodiment of usage, the invention contemplates parsing the content for compression (or encoding, as sometimes used interchangeably herein—the same for decompression and decoding) into discrete constructions, such as words, phrases, etc. The discrete constructions are then passed, one by one or in bulk, to a searching engine, of the existing or newly-developed type, to locate network information at a plurality of network locator identities, e.g., URI's, that corresponds to the discrete constructions. Upon their location and scoring of best searches, a dictionary is created to encode the content as offsets into the network information, so found.

In a computing system environment, the invention may be practiced with a first computing device interacting with a computer program product that allows that allows receipt of an indication from a user for compression of content and for parsing the content into discrete constructions. A second computing device having a searching engine locates network information corresponding to the discrete constructions, whereby the first and second computing devices communicate with one another so that the searching engine can receive the discrete constructions from the first computing device in bulk or singularly. A third computing device hosts the network information at a plurality of URIs. During use, upon locating the network information corresponding to the discrete constructions, the network content is downloadable to the first computing device to create a dictionary to encode the content by indicating offsets into the network information. Computing devices can be physical or virtual machine(s).

Computer program products are also disclosed. For instance, a product available as a download or on a computer readable medium has components to perform the steps of, but not limited to, receiving an indication from a computing device to compress content; parsing the content into discrete constructions; passing the discrete constructions to a searching engine or to search directly to locate network information; creating a dictionary of entries corresponding to the content upon locating the network information; and encoding the content from the dictionary as a series of offsets into the network information.

These and other embodiments of the present invention will be set forth in the description which follows, and in part will become apparent to those of ordinary skill in the art by reference to the following description of the invention and referenced drawings or by practice of the invention. The claims, however, indicate the particularities of the invention.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE ILLUSTRATED EMBODIMENTS

In the following detailed description of the illustrated embodiments, reference is made to the accompanying drawings that form a part hereof, and in which is shown by way of illustration, specific embodiments in which the invention may be practiced. These embodiments are described in sufficient detail to enable those skilled in the art to practice the invention and like numerals represent like details in the various figures. Also, it is to be understood that other embodiments may be utilized and that process, mechanical, electrical, arrangement, software and/or other changes may be made without departing from the scope of the present invention. In accordance with the present invention, methods and apparatus relating to network content in dictionary-based compression and decompression are hereinafter described.

Figure 1:
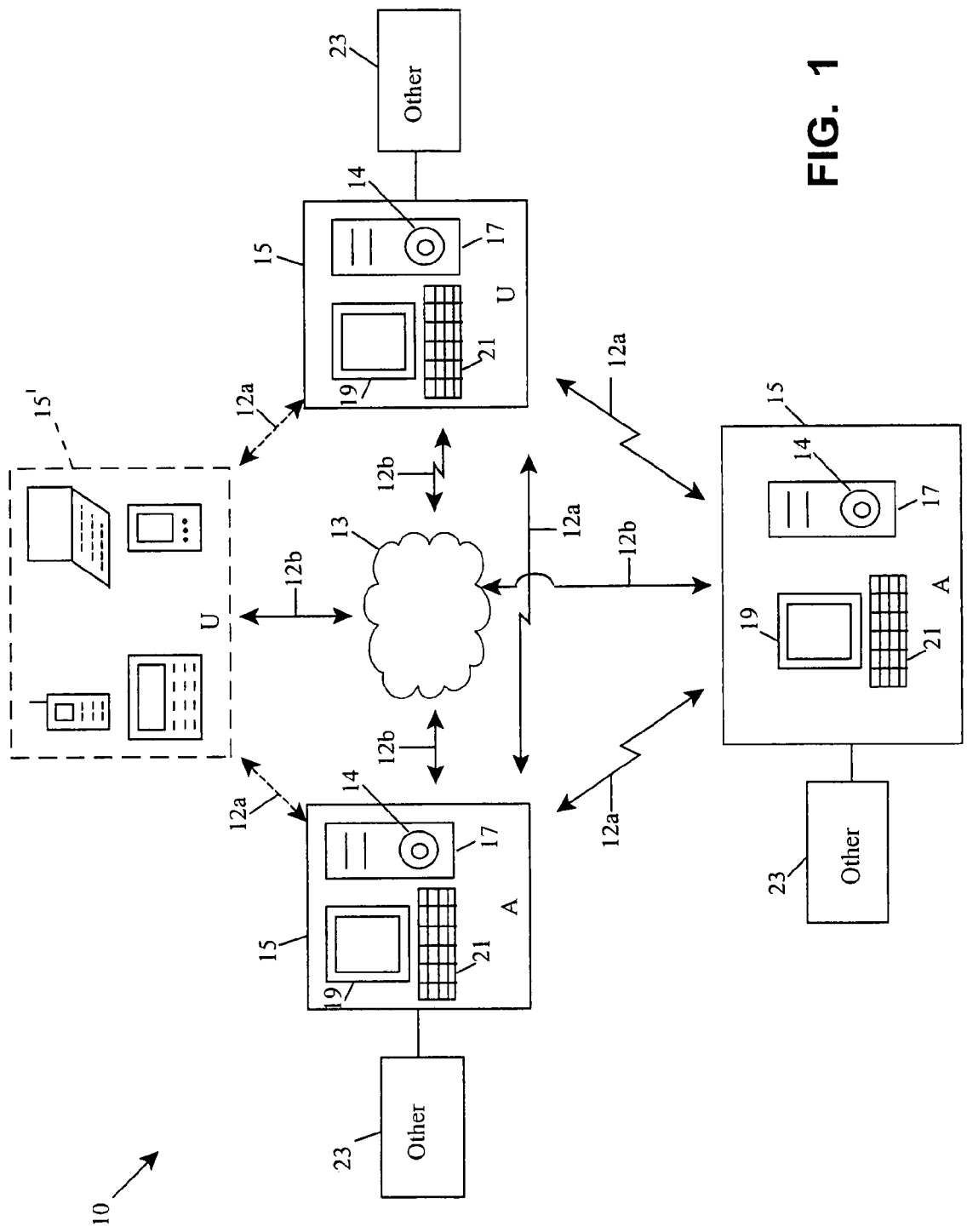
FIG. 1 is a diagrammatic view in accordance with the present invention of a representative computing environment for network content in dictionary-based compression and decompression.

With reference to FIG. 1, a representative computing environment 10 for dictionary-based compression or decompression using network content occurs by way of one or more computing devices 15 or 15' arranged as individual or networked physical or virtual machines. The arrangement and physicalness or virtual-ness of the computing devices are also available to a searching service described below. In a traditional sense, an exemplary computing device typifies a server 17, such as a grid or blade server. Alternatively, it includes a general or special purpose computing device in the form of a conventional fixed or mobile computer 17 having an attendant monitor 19 and user interface 21. The computer internally includes a processing unit for a resident operating system, such as DOS, WINDOWS, MACINTOSH, VISTA, UNIX and LINUX, to name a few, a memory, and a bus that couples various internal and external units, e.g., other 23, to one another. Representative other items 23 include, but are not limited to, PDA's, cameras, scanners, printers, microphones, joy sticks, game pads, satellite dishes, hand-held devices, consumer electronics, minicomputers, computer clusters, main frame computers, a message queue, a peer machine, a broadcast antenna, a web server, an AJAX client, a grid-computing node, a peer, a virtual machine, a web service endpoint, a cellular phone or the like. The other items may also be stand alone computing devices 15' in the environment 10 or the computing device itself.

In either, storage devices are contemplated and may be remote or local. While the line is not well defined, local storage generally has a relatively quick access time and is used to store frequently accessed data, while remote storage has a much longer access time and is used to store data that is accessed less frequently. The capacity of remote storage is also typically an order of magnitude larger than the capacity of local storage. Regardless, storage is representatively provided for aspects of the invention contemplative of computer executable instructions, e.g., software, as part of computer program products on readable media, e.g., disk 14 for insertion in a drive of computer 17. Computer executable instructions may also be available as a download or reside in hardware, firmware or combinations in any or all of the depicted devices 15 or 15'.

When described in the context of computer program products, it is denoted that items thereof, such as modules, routines, programs, objects, components, data structures, etc., perform particular tasks or implement particular abstract data types within various structures of the computing system which cause a certain function or group of functions. In form, the computer product can be a download or any available media, such as RAM, ROM, EEPROM, CD-ROM, DVD, or other optical disk storage devices, magnetic disk storage devices, floppy disks, or any other medium which can be used to store the items thereof and which can be assessed in the environment.

In network, the computing devices communicate with one another via wired, wireless or combined connections 12 that are either direct 12*a* or indirect 12*b*. If direct, they typify connections within physical or network proximity (e.g., intranet). If indirect, they typify connections such as those found with the internet, satellites, radio transmissions, or the like, and are given nebulously as element 13. In this regard, other contemplated items include servers, routers, peer devices, modems, T1 lines, satellites, microwave relays or the like. The connections may also be local area networks (LAN) and/or wide area networks (WAN) that are presented by way of example and not limitation. The topology is also any of a variety, such as ring, star, bridged, cascaded, meshed, or other known or hereinafter invented arrangement.

Figure 2:
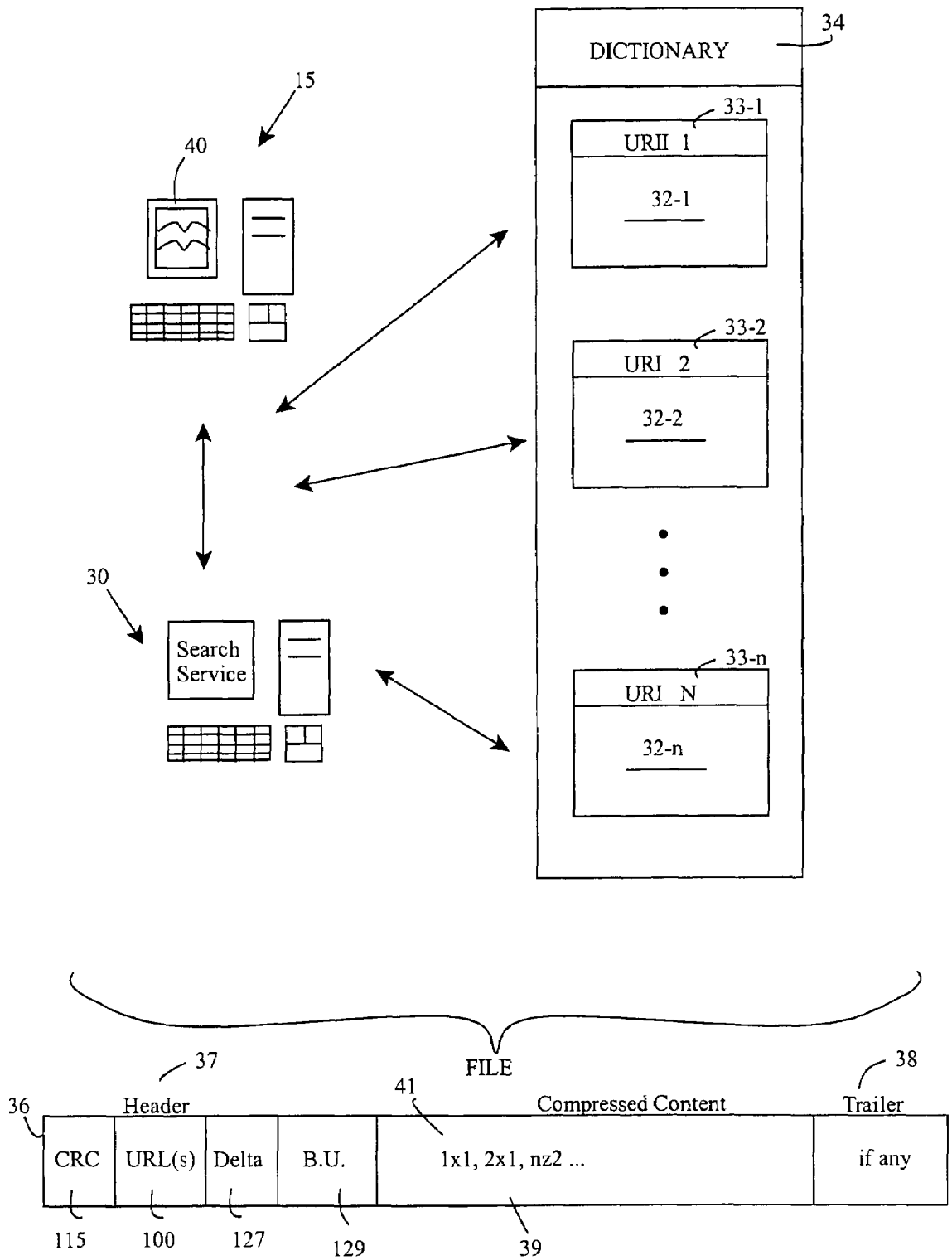
FIG. 2 is a diagrammatic view in accordance with the present invention of a more detailed representative computing environment for network content in dictionary-based compression and decompression.
Figure 3:
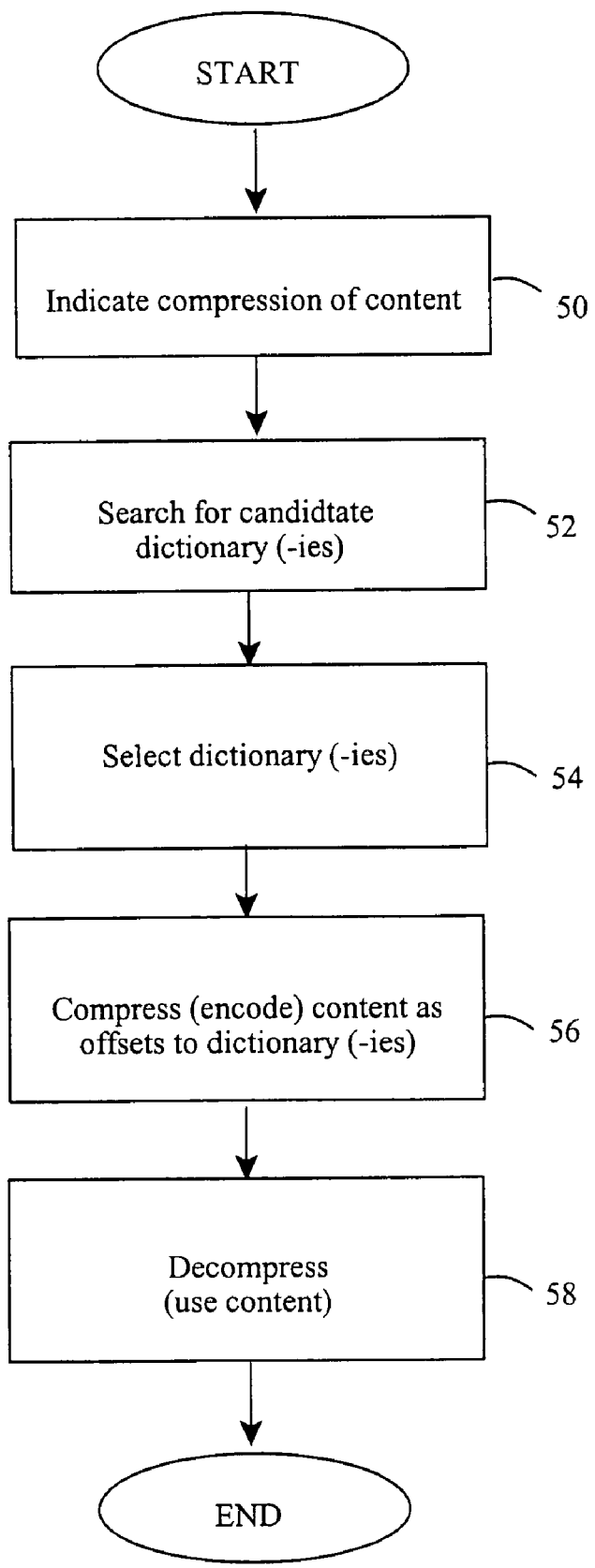
FIG. 3 is a high-level flow chart in accordance with the present invention for network content in dictionary-based compression and decompression.

With the foregoing representative computing environment as backdrop, FIGS. 2 and 3 show high-level diagrams of the overall flow of the invention. That is, a computing device 15 has content 40, such as a document, that is indicated by a user or software as needing compression, step 50. By way of an existing (e.g., Google, Yahoo!, etc.), new or proprietary searching service 30, the subject matter of the content 40 is searched for in various network information 32-1, 32-2, . . . 32-n, e.g., web pages, located on the world wide web network, for example, at network locator identities 33-1, 33-2, . . . 33-n, such as URI-1, URI-2, . . . URI-n, the latter being candidate dictionaries for compressing the content, step 52. Based upon various criteria, the certain of the network information is selected, thereby forming the dictionary 34, step 54. By way of typical compression techniques, the dictionary is used to encode the content, step 56. The result is a compressed file 36 having various headers 37 and/or trailers 38, and the substance of the encoded content is indicated by offsets 39 to the network information 32 found at the network identifier locations or network locator identities 33. In this manner, the vastness of the subject matter of the network, any network, can be leveraged to create an immediate dictionary tailored to the subject matter of the content 40, regardless of the subject matter of the content 40. In other words, that which a single user/computing device might have need of compressing, the snippets thereof can be found on the web, or other network (discussed below), simply because a near endless variety of network information is available on the web and can then serve as a static-dictionary, well-tailored for compression. To later use the content, step 58 provides for decompression of the encoded file asymmetrically to the manner compressed. For example, the indicated offsets 39 to the network information are used in reverse to reconstruct the subject matter of the content 40, as will be seen below. To guard against volatile dictionary changes, such as updated network information, various safeguards are contemplated.

Figure 4:
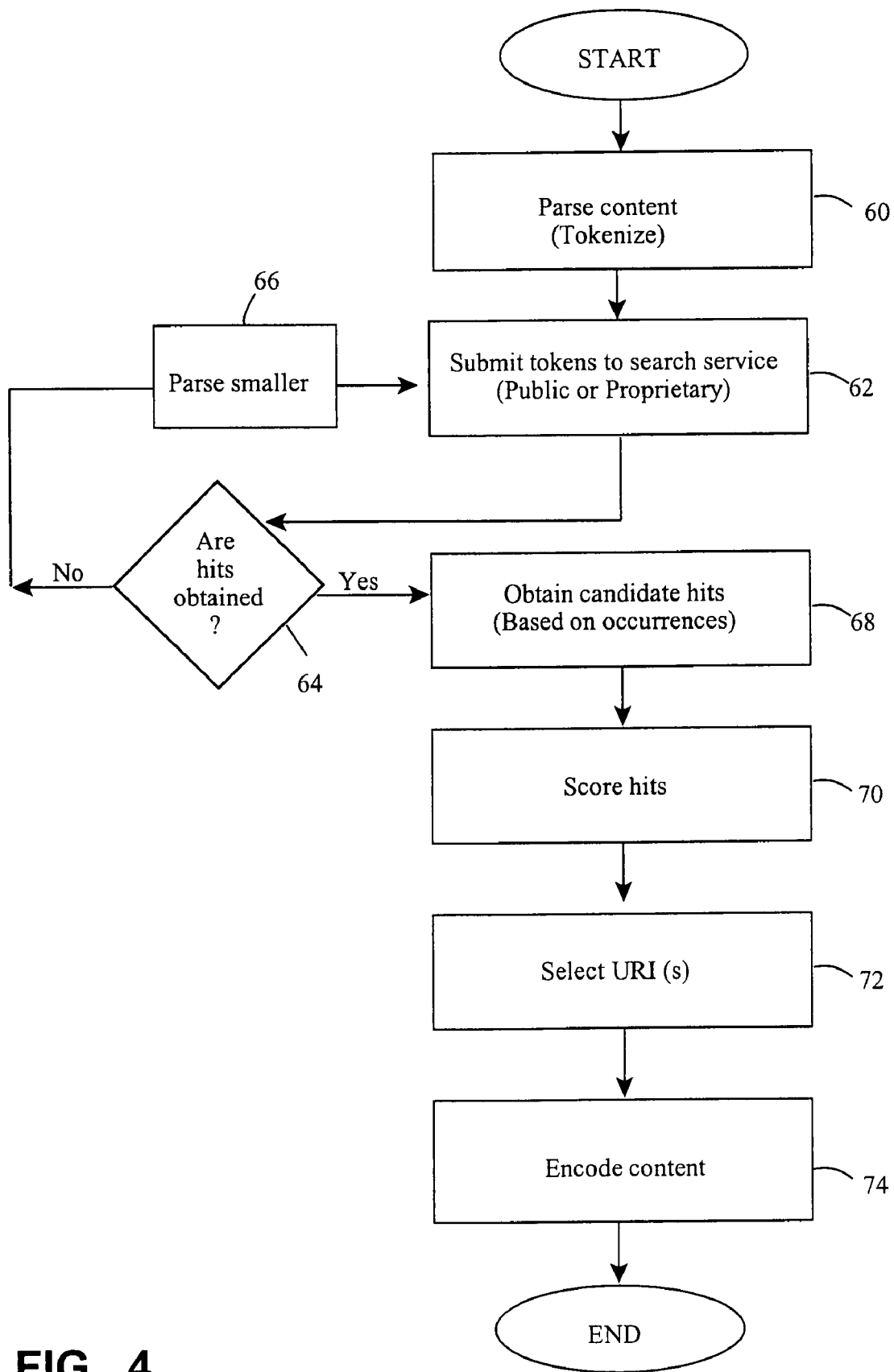
FIG. 4 is a flow chart in accordance with the present invention of a more detailed process for network content in dictionary-based compression.

In more detail, FIG. 4 teaches compression of the content into a file. For this example, the content may be referred to as a "document" with text, but in practice (and with the aid of a suitable search engine) any kind of content could be used. At step 60, the document is programmatically parsed into discrete constructions or tokens, representing either individual words, phrases, sentences, etc. or some combination of letters, words, phrases, sentences, or other constructions. Optionally, and in an embodiment, the user may aid in this process by marking particular phrases manually. Also optionally, and in an embodiment, the user may associate keyword tags with the document or portions thereof to serve as semantic hints for later use in the decoding process. The parsing also contemplates, but does not require, that the discrete constructions will depend on the semantic content of various passages of the document (i.e., on semantic boundaries) to make searching and encoding/decoding easier, faster, etc.

For example, if a document has a phrase about a baseball player's "batting average of 0.333," it will be a better dictionary if the network information is a sporting website whereby batting averages of baseball player's will be typically found. It will also be the situation that the dictionary would find actual percentages (e.g., "0.333") indicating a player's average at such a site. In contrast, if the parsing of the phrase into tokens occurred along the inconvenient semantic boundary of both "batting" and "average," the token "batting" might be found at a website for sewing materials, such as batting for making a quilt. The token "average," on the other hand, might be found at a website indicating an "average" height of children. In either, it might be problematic to then even find the token for "0.333." As a result, skilled artisans will understand how to parse content into semantically convenient phrases.

Regardless of how obtained, the tokens are submitted in bulk, in groups, one by one, etc. to a searching service, step 62. A subset of the tokens (possibly representing the most relevant keywords or key phrases pertinent to the subject matter of the source document, e.g., the baseball player's "batting average") might be chosen as a first search input, to save time. Otherwise all tokens can be submitted for search, with or without additional semantic "salting" (i.e., extra keywords that are relevant to the document but not actually present inside it. In the case of the baseball player's "batting average" additional information might include the actual word "baseball" that is otherwise missing from "batting average of 0.333," but being the understood subject matter.).

In form, the searching service (which may be a public service on the web, or a private service associated with a particular network) brings back "hits," at step 64, based on occurrences of the exact phrasings of the words in the tokens, e.g., the token "batting average" might representatively be found at the website www.espn.com. On the other hand, if no hits are obtained for the token at step 64, the token is parsed smaller at step 66 until hits are eventually received for the smaller parcels. For instance, if the initial parsing for the token "batting average of 0.333" fetched no hits, a re-parsing of the original token into smaller tokens might consist of 1) "batting average" and 2) "0.333." Of course, skilled artisans will be able to readily imagine others.

At step 68, the network identifier locations, e.g., URI's, to the various hits are accumulated and tallied, and their relevancy scores (if provided) are retained, step 70. For instance, the token "batting average of 0.333," may be found at the sporting website www.espn.com (actual website) and the sporting website www.bob'shomegrownmadeupnumbersformyfavoriteplayers.com (fictional website). Based on the URI's, a certain level of confidence may be garnered for the former, but not the latter. In such instance, the former may be scored higher than the latter. Similarly, the earlier sewing material website might also return a "batting average" for an average consistency of batting materials for quilts, but have no nexus to the actual token being searched for, e.g., batting averages for a baseball player. Thus, the results are then analyzed to obtain and select a best match, step 72, between the various tokens of the parsed input document and the various URIs obtained via search, the objective being to find the web page (or pages or other network information) having the greatest text homology to the input document based on token matchings. In the foregoing example, the www.espn.com would then score higher over the "bob's" website and the sewing material website. In at least one embodiment, "homology" will be determined by direct comparison of the input document to the web page text (using scoring heuristics similar in spirit to Levenstein Distance), while in another embodiment the homology test (and best match determination) will simply involve a comparison of the input-document vocabulary and word frequency to web-page vocabulary and word frequency (or heuristics based thereupon). In yet another embodiment, the web page will be pre-tested/pre-screened based on keywords contained in its <meta> tags (if any). In still another embodiment, the previous steps will have resulted in multiple URIs, pointing to a set of web pages representing candidate dictionaries. A given URI might be declared "optimal" based on its giving better compression, when used as a dictionary, than the content at any other candidate URI. Encoding the content by way of encoding the individual tokens parsed from the content occurs at step 74 by way of the dictionary so found by the search engine.

Figure 5A:
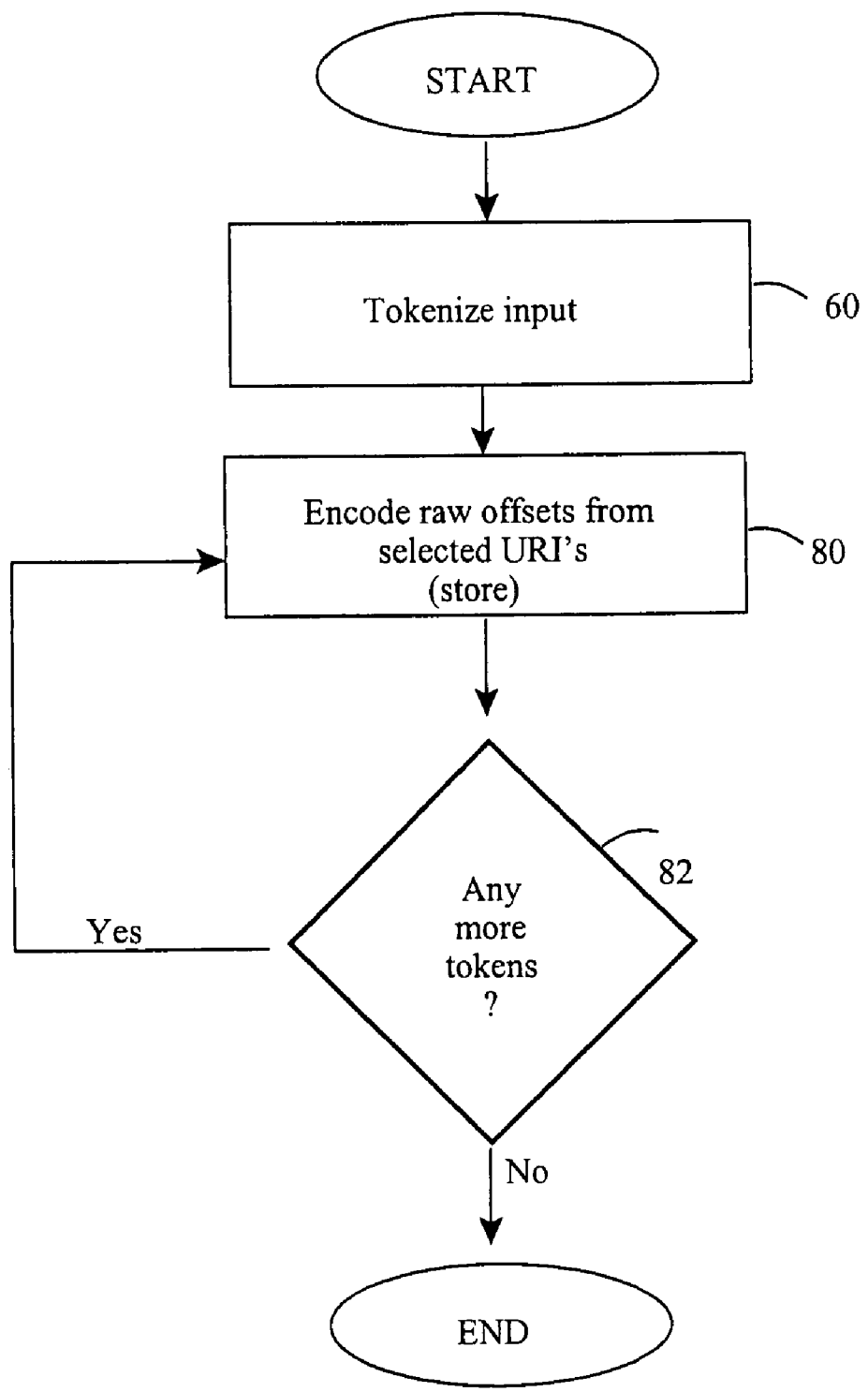
FIGS. 5A and 5B are flow charts in accordance with the present invention of a more detailed process for network content in dictionary-based compression, including offsets.

With reference to FIG. 5A, a first encoding option is as follows. At step 60, the content to-be-compressed is tokenized, as before, and the tokens are read sequentially. For each input token, a matching token in the dictionary of entries (e.g., web page) is found. The offset of this spot in the dictionary page (whether from the beginning of the page or from a particular marker or easily-locatable spot within the page) is noted. That offset is written to output as a binary number of the appropriate bit length, step 80. The next input token is then consulted and the entire process repeated, step 82, until all input tokens have been processed.

Figure 5B:
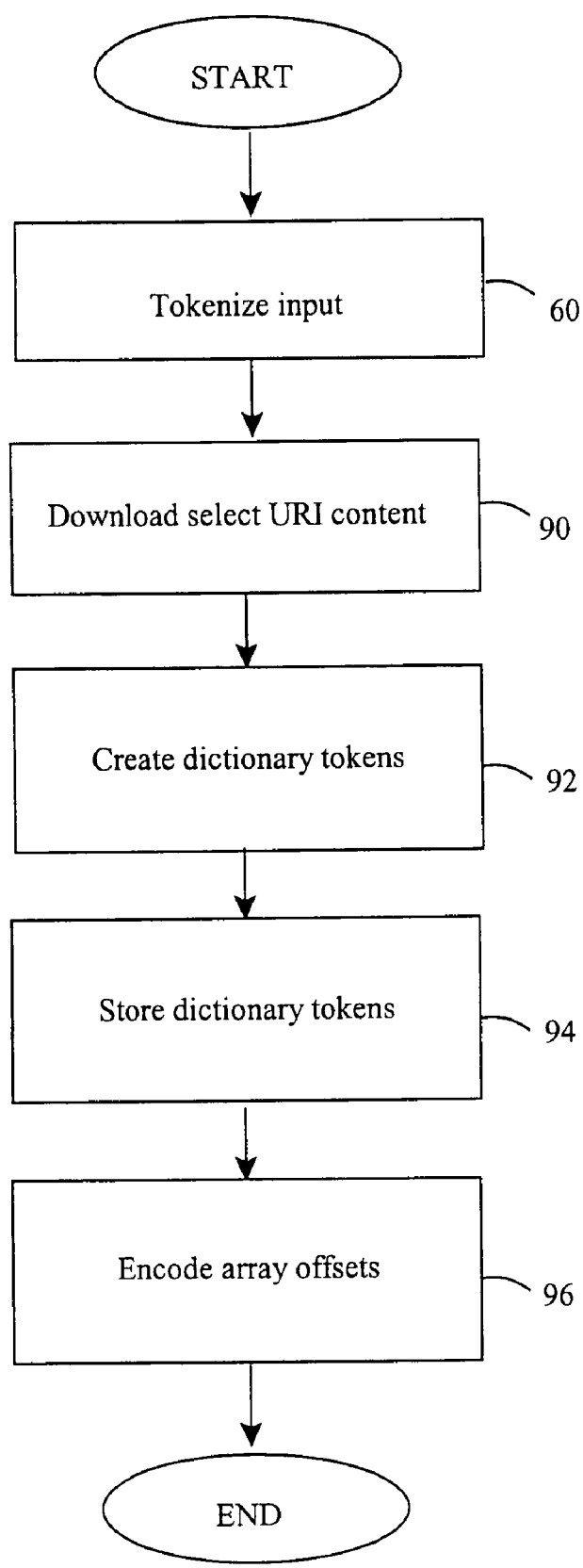

With reference to FIG. 5B, a second encoding option is as follows. At step 60, the input is tokenized. The network information at the given network identifier location, e.g. URI, is downloaded and preprocessed (canonicalized in some way, such as to remove markup), step 90. At step 92, the downloaded information is then tokenized into dictionary tokens. In various optional embodiments, the dictionary tokens are filtered or processed to reject duplicates, reject tokens according to particular fitness requirements, alphabetized, etc. The results are optionally also sorted according to a predetermined criteria, then stored in an array or other suitable data object, step 94. (Skilled artisans will appreciate the procedure will be designed such that the decompressor can later obtain the content at the same URI, subject it to the same procedure, and end up with the same array.) Encoding, at step 96, proceeds as above, except that the offset values written to output represent array offsets rather than raw offsets into page content.

As before, but with multiple dictionary pages (e.g, multiple pages from multiple URIs) serving as input to the tokenizer, the dictionary array contains vocabulary from multiple sources. In either encoding embodiment, the actual location of the network identifier locations (URIs) corresponding to the dictionary source material are bundled with the output either in a header or trailer, such as at 100 in the header 37 (FIG. 2).

Figure 6:
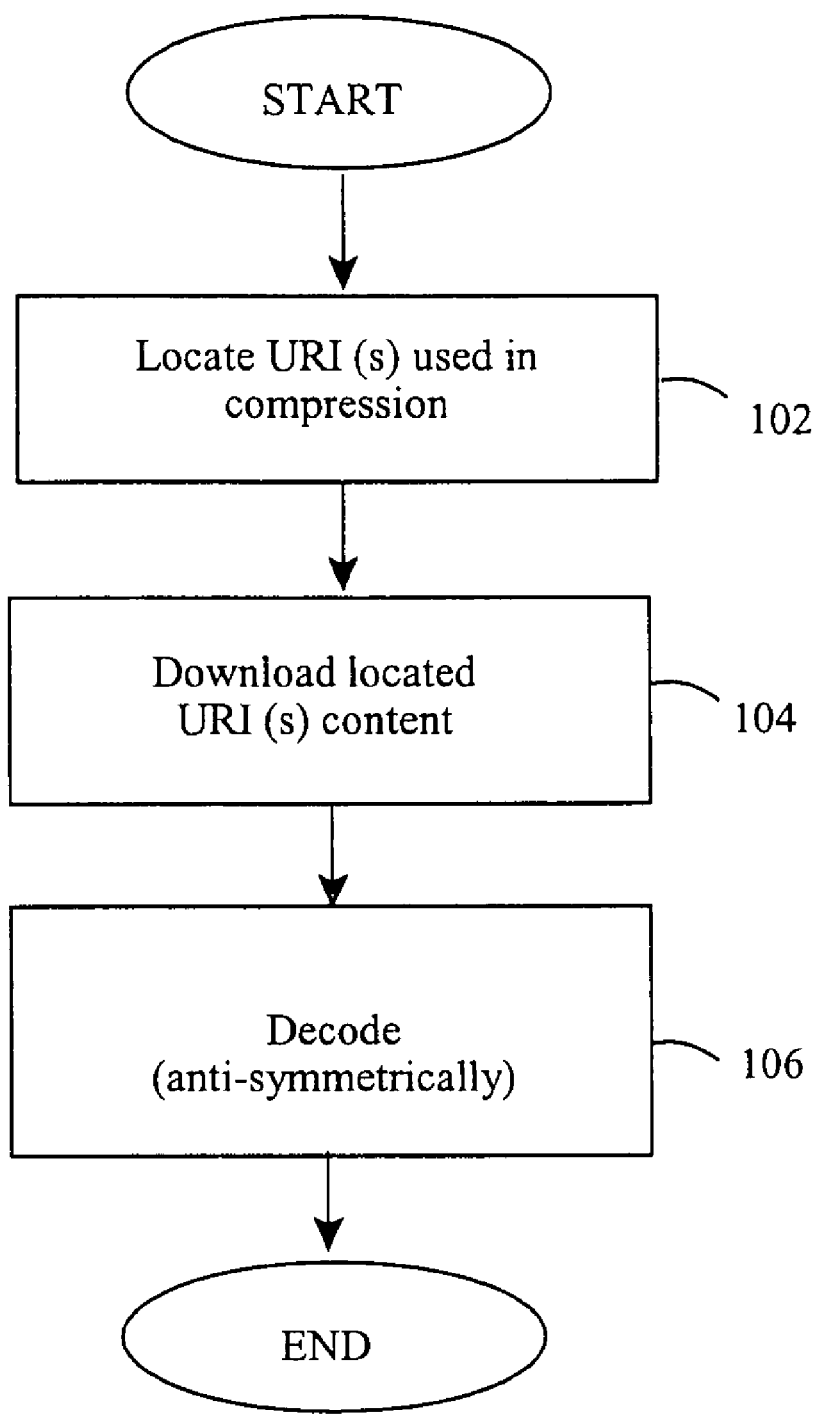
FIG. 6 is a flow chart in accordance with the present invention of a more detailed process for network content in dictionary-based decompression.

With reference to FIG. 6, decoding of the compressed file occurs first by locating the URI(s) used in the compression of the original content, step 102. At step 104, the relevant network information of the located URI(s) is downloaded. The decoding then occurs anti-symmetrically to the encoding, step 106.

In more detail, if the compressed content was encoded according to that in FIG. 5B, the downloaded content is tokenized, processed, and stored in an array. Compressed content is decompressed by direct lookup of dictionary values using the offset stored in the file (or in other words, decompression proceeds in anti-symmetric manner to the way compression was performed). Otherwise, decoding in an anti-symmetric manner occurs by way of raw offsets to the network information at the network identifier location.

Appreciating that if the dictionary source content used in an implementation comes from the World Wide Web, there will be a risk that between the time compression occurs and decompression occurs, the dictionary page could have changed. In turn, this could result in corruption of the dictionary and data loss during decompression. The invention, thus, is fairly safe for when it can be assured that a given dictionary page is immutable, or is a point-in-time snapshot or archival copy of the referenced page is available. In that many corporate intranets with large amounts of static content, or content-management systems exist that can provide archival content on demand, the foregoing is not an unlivable requirement. But certainly in some cases, these requirements will be compromised and a strategy for dealing with volatile dictionary content is as follows.

Figure 7:
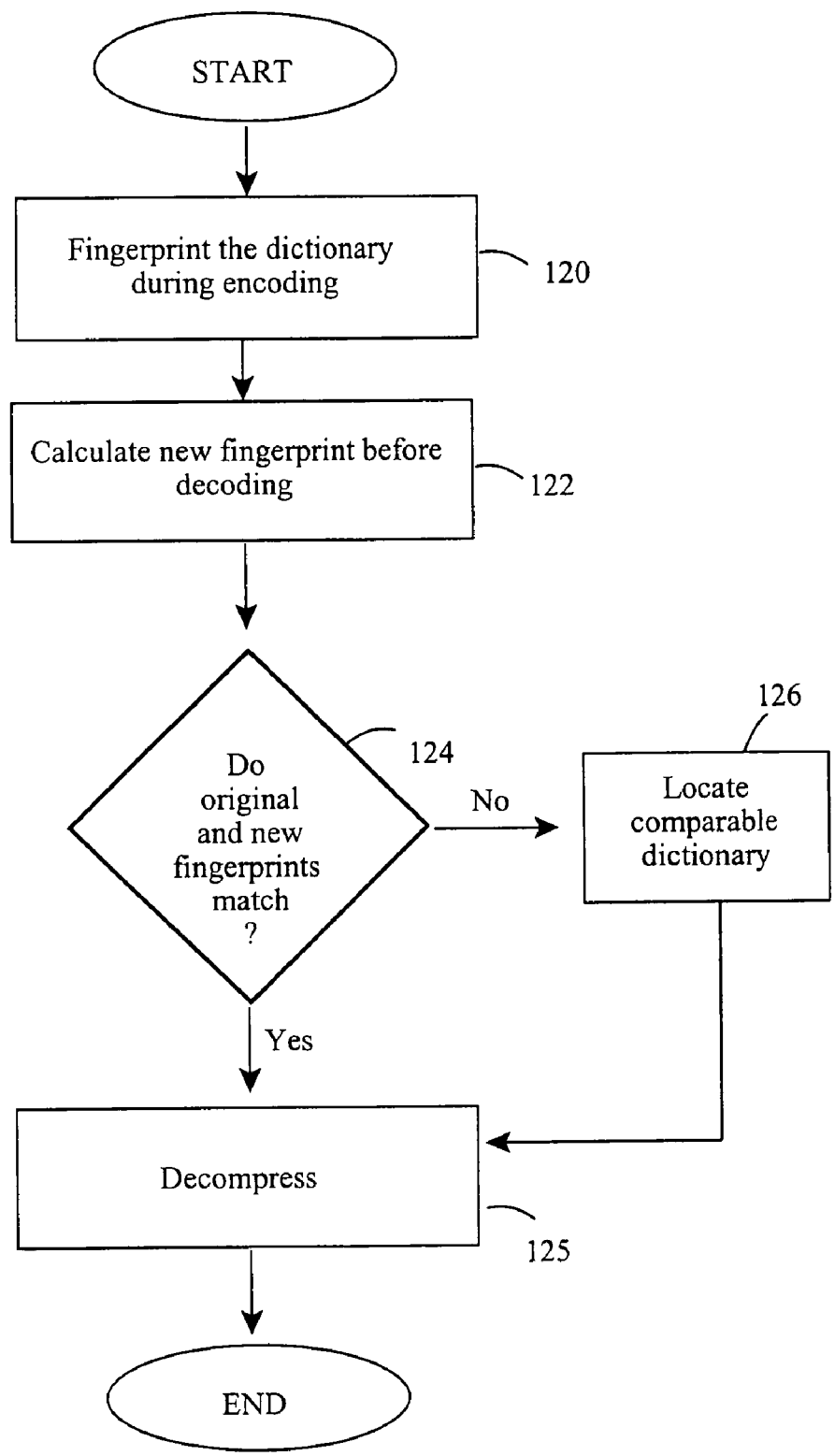
FIG. 7 is a flow chart in accordance with the present invention of a more detailed process for network content in dictionary-based compression and decompression, including overcoming volatile dictionary content.

In FIG. 7, a dictionary page, once selected, is processed in the manner described to produce a canonicalized dictionary array. Then the dictionary is fingerprinted step 120, such as by hashing to give a CRC, checksum, digest, or other summary value (and saving same in the compressed file at 115, FIG. 2).

During decompression, a decompressor would consult the dictionary URI (as before) and go through the described procedures to (re)construct a dictionary array. The decompressor would then calculate a new dictionary fingerprint, step 122, and compare it (step 124) to the value stored in the compressed file at 115. If the values match (e.g., authenticity verified), decompression occurs at step 125, as before. If the values do not match (e.g., authenticity not verified), the new dictionary is not the same as the old one and data integrity will be compromised during decompression unless a suitable replacement dictionary can be located. Therefore, the decompressor will (in an embodiment) contain logic that attempts to locate another URI that points to content that yields a dictionary having the same fingerprint as the one stored in the compressed file. This step could amount to a brute-force search, of course, but that would be generally time consuming. Hence a further novelty is providing for the locating of a new dictionary comparable to the original dictionary, step 126.

During the "dictionary locating" steps, candidate dictionaries will be analyzed for shared (overlapping) vocabulary. Any tokens in any one dictionary that do not occur in the others will be discarded so that in the end, a final vocabulary is derived that represents the intersection of the candidate vocabularies. This final vocabulary is the one that will be used in compression. But for each candidate vocabulary, a delta is determined, representing the difference between the candidate vocabulary and the common vocabulary. The delta(s) will be stored at 127, FIG. 2 in the compressed file along with the URIs 100 to the respective dictionary pages. Thus, it will be possible for the decompressor to go to any of the URIs, obtain a raw vocabulary, canonicalize it, and refine the result (using the delta data) so as to convert it to the form needed for decompression. In essence, the compressed file contains multiple URIs to backup dictionaries at 129. If one server is down, or if one dictionary yields an incorrect checksum, the decompressor can consult another URI to obtain the information needed to build a valid dictionary.

To adapt the foregoing for use by LZW, Deflate, and other existing methods, an embodiment of the contemplates being able to implement LZW or other algorithms in such a way that web-derived dictionary data can be used to prime the pump (e.g., pre-fill internal dictionaries, hash tables, etc.) so that efficient compression can occur immediately when the compression logic encounters input. Anyone skilled in the art will recognize that this can be achieved in code in a number of ways. For instance, when data has been compressed, a URI would of course be included in the compressed file output so that the decompressor could locate the online content required for initializing the program's internal buffers.

Figure 8:
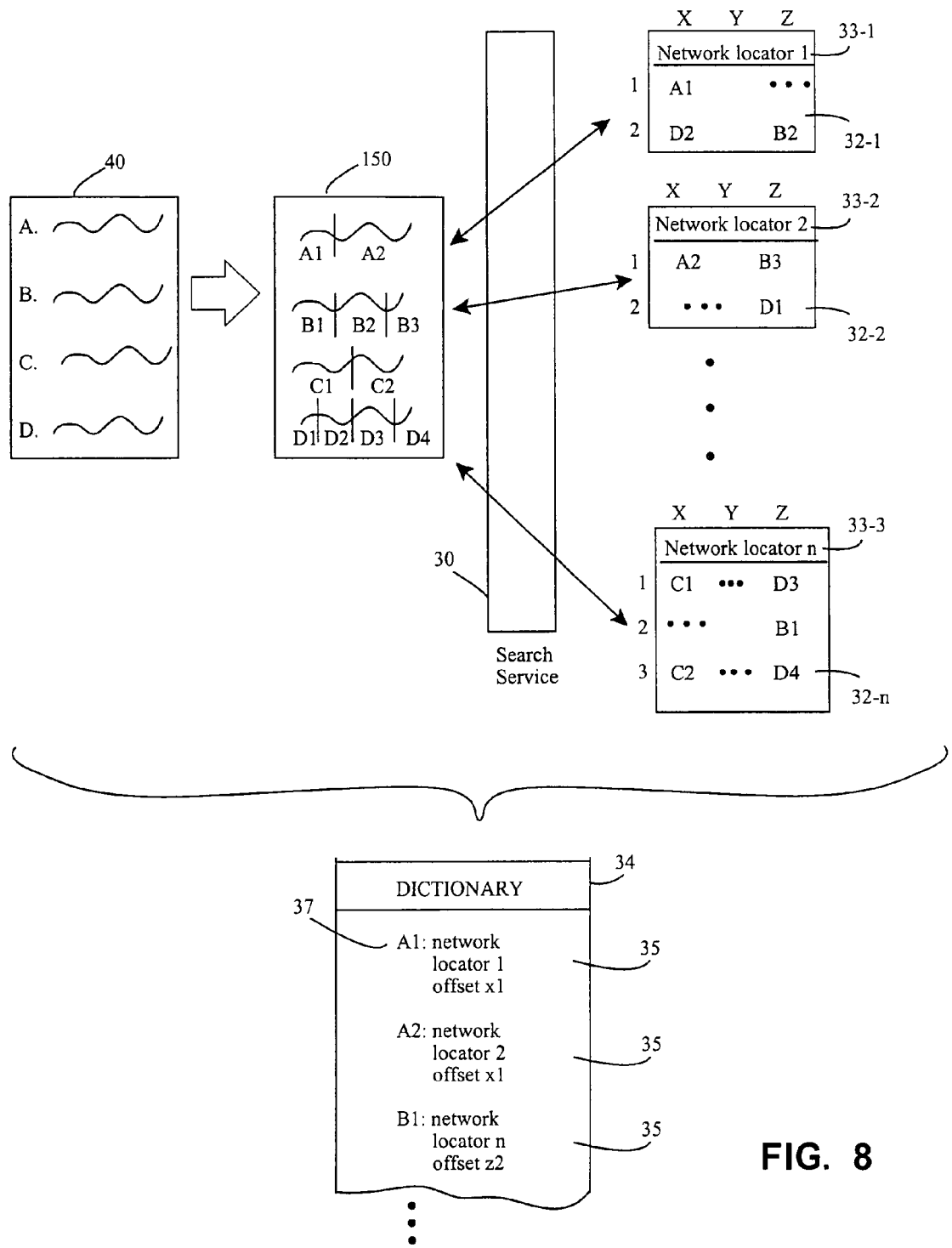
FIG. 8 is a diagrammatic view in accordance with the present invention of a more detailed use of network content in dictionary-based compression and decompression.

With reference to FIG. 8, the foregoing can be summarized somewhat diagrammatically. That is, the content to be compressed 40 on a computing device is parsed into discrete constructions 150, such as A1 and A2 for original A in content 40. Similarly, original B in content 40 is tokenized into B1, B2, and B3 as C is tokenized into C1 and C2 and D is tokenized into D1, D2, D3 and D4. By way of the searching service 30, again proprietary, existing or new, the tokens are searched for in network information 32-1, 32-2, . . . 32-n in a network, such as the world wide web, by way of network identifier locations 33-1, 33-2, . . . 33-n. Upon finding or locating the tokens in the network information, a dictionary of entries 34 for encoding is created and the offsets 35 are used to make a compressed file 36, FIG. 2, with indicated offsets 39, FIG. 2.

As a representative example of raw offsets, tokens A1, D2 and B2 are found in the network information 32-1. Their offsets into the information is given rudimentarily by the grid having columns X, Y, Z and rows 1 and 2. In turn, the token A1, is recorded as an offset by the grid X1 and network identifier location 1. The dictionary 34, then, has a corresponding entry 37 that is used at 41 in the indicated offsets 39 in FIG. 2 to show where the token was found so that later decompression can occur. As given, 41 represents "1X1" meaning that the network identifier location "1" at grid "X1" is where token A1 is located. Of course, skilled artisans will appreciate that the offsets on a grid are not the actual way metadata, for example, is coordinated for a web page or other network information. Thus, the actual offset would be slightly different than that shown.

In various other embodiments, the invention contemplates referencing a user's archived e-mail as a source of static, immutable dictionary content instead of referencing world wide web content. Obviously, if a user were to encode files locally, based on offsets into his own archived e-mail, no one else would be able to decipher such files without access to the person's archived e-mail. While this might not have universal appeal, it does mean that the user can encode files securely for personal use. For instance, suppose the user's e-mail is archived on local drive D: and the user wants to compress a file that is located on another drive, say drive E: using his e-mail archives as a dictionary library. Imagine now that E: is a USB stick and suppose someone steals the USB stick. The compressed files on the USB stick are then of no use to the thief, since they cannot be decoded without reference to the user's drive D.

Embodiments of the invention could also be extended in the manner just described to allow a user to designate any folder, directory, or disk in his or her file system to be used as the "dictionary-search starting point" for compressing any arbitrary file. The compressor would look at the file type (and/or any other metadata associated with the file) to obtain hints for how to begin searching for dictionary reference files. Beagle could be enlisted in finding semantically appropriate results. Files chosen for use as dictionary source material would be marked as immutable (read-only), to ensure data integrity during later decompression.

In any embodiment, certain advantages and benefits over the prior art should be readily apparent. For example, but not limited to, the invention: 1) treats the world wide web, or other network, as a giant, distributed concordance, for use in defining and well-tailoring portions (tokens) of to-be-compressed content in dictionaries; 2) uses searching engine technology to find semantically tailored online dictionary material for improving the compression efficiency of dictionary-based algorithms; 3) uses a dictionary derived from semantically screened online content to pre-initialize the buffers (or internal dictionaries) of conventional compression routines like LZW and Deflate; and 4) ensures robustness through the use of fingerprinting and pointers to one or more backup dictionaries (and methods for deriving canonicalized content from the backups by usage of deltas to get back to a common vocabulary).

Finally, one of ordinary skill in the art will recognize that additional embodiments are also possible without departing from the teachings of the present invention. This detailed description, and particularly the specific details of the exemplary embodiments disclosed herein, is given primarily for clarity of understanding, and no unnecessary limitations are to be implied, for modifications will become obvious to those skilled in the art upon reading this disclosure and may be made without departing from the spirit or scope of the invention. Relatively apparent modifications, of course, include combining the various features of one or more figures with the features of one or more of other figures.

The invention claimed is:

1. In a computing system environment, a method of dictionary-based compression or decompression, comprising:
   receiving an indication for compressing content;
   searching the content to locate network information at a network locator identity that corresponds to the content;
   upon locating the network information corresponding to the content, creating a dictionary entry corresponding to the content; and
   encoding the content from the dictionary entry based on network information found at the network locator identity.

2. The method of claim 1, further including searching for candidate network information at a plurality of network locator identities.

3. The method of claim 1, wherein the encoding the content further includes indicating offsets to the network information.

4. The method of claim 1, further including parsing the content into pluralities of discrete constructions searchable in the network information.

5. The method of claim 1, further including fingerprinting the network information so that during decoding of the encoded content, the network information can be verified as authentic.

6. The method of claim 5, further including searching for a set of network information at a second network locator identity comparable to the network information at the network locator identity in the event the network information cannot be verified as authentic.

7. In a computing system environment, a method of dictionary-based compression or decompression, comprising:
   indicating content for compression;
   parsing the content into discrete constructions;
   searching the discrete constructions to locate network information at a plurality of network locator identities that corresponds to the discrete constructions;
   upon locating the network information corresponding to the discrete constructions, creating a dictionary of entries corresponding to the content; and
   encoding the content from the dictionary of entries by indicating offsets to the network information corresponding to the discrete constructions per each of the network locator identities.

8. The method of claim 7, further including creating a compressed file of the encoded content having both the indicated offsets and one of a header and trailer.

9. The method of claim 7, further including decoding the encoded content by way of the dictionary of entries.

10. The method of claim 7, further including fingerprinting the network information so that during decoding of the encoded content, the network information can be verified as authentic.

11. The method of claim 7, further including passing the discrete constructions to a searching engine one discrete construction at a time.

12. A computer program product having executable instructions for performing the steps of claim 7.

13. A computer program product available as a download or on a computer readable medium having executable instructions for undertaking dictionary-based compression or decompression, comprising:
   receiving an indication for compressing content;
   parsing the content into discrete constructions;
   passing the discrete constructions to a searching engine to locate network information at a plurality of uniform resource identifiers that corresponds to the discrete constructions;
   upon the locating the network information corresponding to the discrete constructions, creating a dictionary of entries corresponding to the content; and
   encoding the content from the dictionary of entries by indicating offsets to the network information corresponding to the discrete constructions per each of the uniform resource identifiers.

14. The computer program product of claim 13, further including downloading the network information.

15. The computer program product of claim 13, further including creating a compressed file of the encoded content having the indicated offsets and one of a header and trailer.

16. The computer program product of claim 13, further including fingerprinting the network information so that during decoding of the encoded content, the network information can be verified as authentic.

17. A computing system environment for undertaking dictionary-based compression or decompression, comprising:
   a first computing device interacting with a computer program product that allows receipt of an indication from a user for compression of content and for parsing the content into discrete constructions;
   a second computing device having a searching engine to locate network information corresponding to the discrete constructions, the first and second computing devices communicating with one another so that the searching engine can receive the discrete constructions from the first computing device; and
   a third computing device hosting the network information at a plurality of uniform resource identifier locations, the second computing device communicating with the third computing device, wherein during use upon locating the network information corresponding to the discrete constructions, the network content is downloadable to the first computing device to create a dictionary of entries corresponding to the content and to encode the content from the dictionary of entries by indicating offsets to the network information per each of the uniform resource identifier locations.

18. A computer program product available as a download or on a computer readable medium having executable instructions for undertaking dictionary-based compression or decompression, comprising:
   a first component to receive an indication from a computing device to compress content;
   a second component to parse the content into discrete constructions;
   a third component to pass the discrete constructions to a searching engine or to search directly to locate network information at a plurality of uniform resource identifier locations that corresponds to the discrete constructions;
   a fourth component configured to creating a dictionary of entries corresponding to the content upon the locating the network information; and
   a fifth component to encode the content from the dictionary of entries by indicating offsets to the network information per each of the uniform resource identifiers.

19. The computer program product of claim 18, further including a sixth component to score a best match of the network information.

20. The computer program product of claim 18, further including a sixth component to fingerprint the network information for later verifying authenticity.

21. The computer program product of claim 18, further including a sixth component to arrange the encoded content as a file having the indicated offsets and one of a header and a trailer.

22. The computer program product of claim 18, further including a sixth component configured to pass the discrete constructions to the searching engine one discrete construction at a time.

23. The computer program product of claim 20, further including a seventh component configured to search for a set of network information at another uniform resource identifier location in the event the sixth component cannot verify authenticity of the network information.

* * * * *